United States Patent
Kim

(10) Patent No.: US 7,555,686 B2
(45) Date of Patent: Jun. 30, 2009

(54) SEMICONDUCTOR DEVICE, TEST BOARD FOR TESTING THE SAME, AND TEST SYSTEM AND METHOD FOR TESTING THE SAME

(75) Inventor: Woo-seop Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 11/483,753

(22) Filed: Jul. 10, 2006

(65) Prior Publication Data

US 2007/0022334 A1    Jan. 25, 2007

(30) Foreign Application Priority Data

Jul. 11, 2005    (KR)    .................... 10-2005-0062368

(51) Int. Cl.
*G01R 31/28*    (2006.01)
(52) U.S. Cl. ......................................... 714/724; 714/30
(58) Field of Classification Search ................. 438/301; 324/765; 327/116; 714/724, 733, 718, 30
See application file for complete search history.

(56) References Cited

U.S. PATENT DOCUMENTS

| 5,633,634 | A | | 5/1997 | Pawlowski | |
| 5,677,914 | A | * | 10/1997 | Fulcomer et al. | ............ 714/724 |
| 5,933,739 | A | * | 8/1999 | Lin | ............................ 438/301 |
| 6,169,500 | B1 | | 1/2001 | Eriksson et al. | |
| 6,744,272 | B2 | * | 6/2004 | Ernst et al. | ................... 324/765 |
| 6,980,036 | B2 | * | 12/2005 | Kwon et al. | ................. 327/116 |
| 7,305,598 | B1 | * | 12/2007 | Sanghani et al. | ............ 714/724 |
| 7,401,281 | B2 | * | 7/2008 | Dreibelbis et al. | .......... 714/733 |
| 2004/0133834 | A1 | | 7/2004 | Kanemitsu et al. | .......... 714/742 |
| 2005/0258856 | A1 | * | 11/2005 | Kishimoto et al. | .......... 324/765 |

FOREIGN PATENT DOCUMENTS

| DE | 69715409 | 8/2003 |
| JP | 8262087 | 10/1996 |
| JP | 2001-289915 | 10/2001 |
| JP | 2003-004809 | 1/2003 |
| KR | 10-2003-0049481 | 6/2003 |
| WO | 9749186 | 12/1997 |

* cited by examiner

*Primary Examiner*—David Ton
(74) *Attorney, Agent, or Firm*—Mills & Onello LLP

(57) ABSTRACT

Provided are a semiconductor device, a test board, and a test system and method for testing a semiconductor device. The semiconductor device includes an input terminal to which test pattern data is serially input at a first speed and an output terminal which one-to-one corresponds to the input terminal and serially outputs the test pattern data to the outside at a second speed that is different from the first speed.

24 Claims, 10 Drawing Sheets

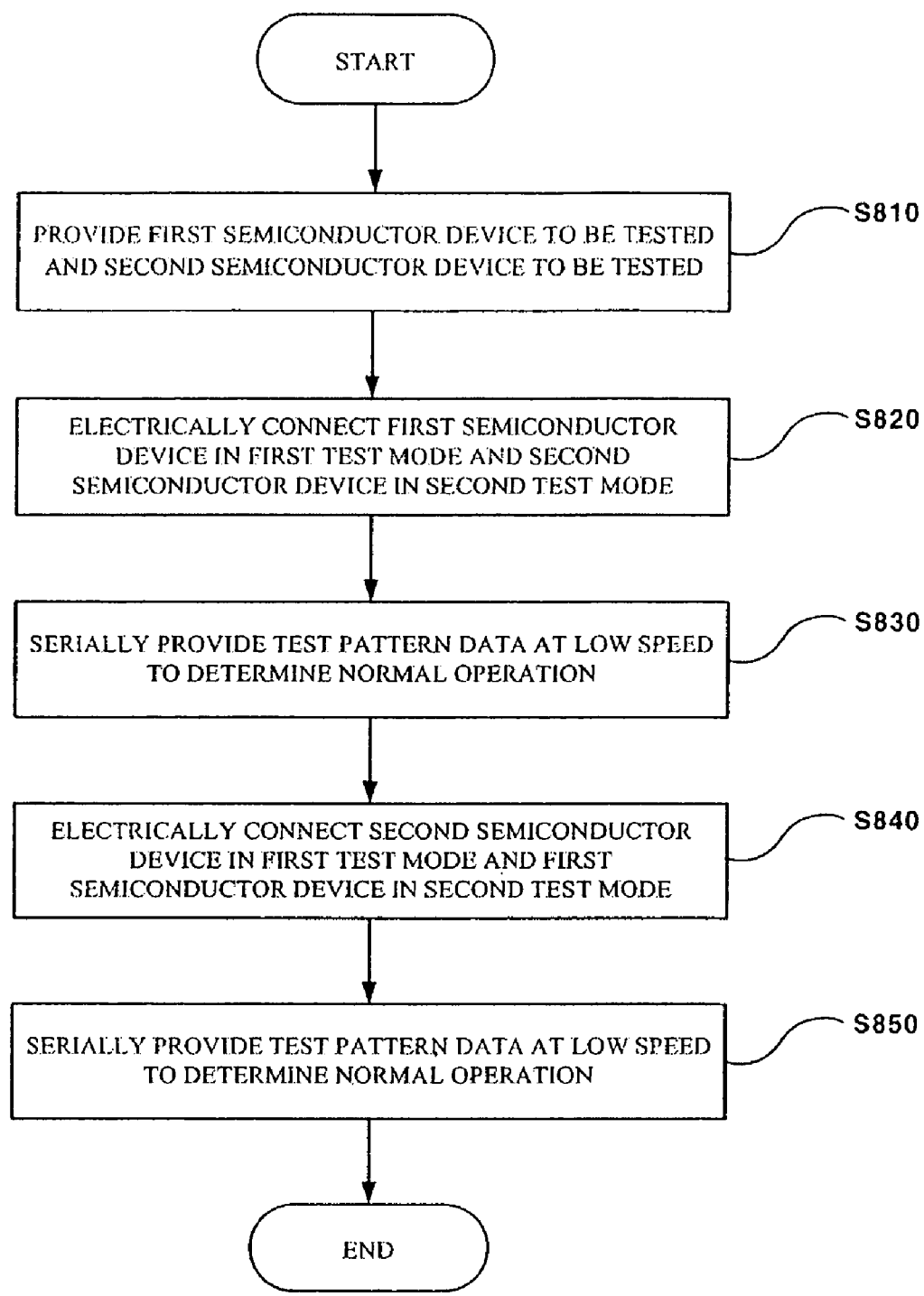

SEMICONDUCTOR DEVICE, TEST BOARD FOR TESTING THE SAME, AND TEST SYSTEM AND METHOD FOR TESTING THE SAME

This application claims priority from Korean Patent Application No. 10-2005-0062368 filed on Jul. 11, 2005 in the Korean Intellectual Property Office, the contents of which are incorporated herein by reference in their entirety.

BACKGROUND OF THE INVENTION

1. Field of the Invention

The present invention relates to a semiconductor device, a test board for testing the same, and a test system and method for testing the same, and more particularly, to a semiconductor device, a test board for testing the same, and a test system and method for testing the same which have high test reliability.

2. Description of the Related Art

After fabrication of a semiconductor device is completed, the semiconductor device is typically subjected to a performance test to check if a failure occurred during the manufacturing process. However, to test input/output terminals of a high-speed operating semiconductor device, a tester should be capable of providing test pattern data at high speed and reading high-speed test pattern data output from the semiconductor device. Thus, as the operating speed of a semiconductor device increases, a high-speed operating tester is required to test the semiconductor device, thereby increasing the testing cost. Conventionally, in order to test a high-speed operating semiconductor device using a low-speed operating tester, a system built-in scheme, a built-in self test (BIST) scheme, and a SERialize/DESerialize (SERDES) scheme have been used.

In the system built-in scheme, a semiconductor device is mounted in a system such as a computer and the system is powered to test the performance of the semiconductor device. In this scheme, the testing cost increases because the system should be powered.

In the BIST scheme, a semiconductor device includes a BIST circuit, generates high-speed test pattern data, and its performance is tested using the generated test pattern data. In this scheme, the BIST circuit is very complicated and it is difficult to detect a failure of the semiconductor device when the BIST circuit is damaged or has a defect.

In the SERDES scheme, test pattern data is input in parallel at low speed through a plurality of input terminals of a semiconductor device, and the test pattern data is converted into serial data to generate high-speed test pattern data. The serial high-speed test pattern data is then converted into parallel data and is output through a plurality of output terminals. Thus, in this scheme, a plurality of input terminals and a plurality of output terminals are required to test the performance of a single input terminal and an output terminal of the semiconductor device.

SUMMARY OF THE INVENTION

The present invention provides a semiconductor device which can be reliably tested.

The present invention also provides a test board for testing a semiconductor device with high reliability.

The present invention also provides a test system for testing a semiconductor device with high reliability.

The present invention also provides a test method for testing a semiconductor device with high reliability.

According to an aspect of the present invention, there is provided a semiconductor device including an input terminal and an output terminal. Test pattern data is serially input to the input terminal at a first speed. The output terminal one-to-one corresponds to the input terminal and serially outputs the test pattern data at a second speed that is different from the first speed.

In one embodiment, the second speed is higher than the first speed in a first test mode and the second speed is lower than the first speed in a second test mode.

In one embodiment, the second speed is n times higher than the first speed and the test pattern data is input to the input terminal without repetition, and the output terminal outputs the test pattern data n times repetitively, where n is natural number.

In one embodiment, the first speed is n times higher than the second speed and the test pattern data is input to the input terminal inputs n times repetitively and the output terminal outputs the test pattern data without repetition, where n is natural number.

In one embodiment, the device further comprises a feed-through path that electrically connects the input terminal and the output terminal without passing through an internal circuit, wherein the test pattern data is transmitted through the feed-through path. In one embodiment, the device further comprises a speed converting unit that is formed on the feed-through path, receives test pattern data from the input terminal, and serially provides the test pattern data to the output terminal at the second speed. In one embodiment, the device further comprises a first test pattern data storing unit which serially stores the test pattern data in synchronization with a first clock signal at the first speed; and a second test pattern data storing unit which receives and stores the test pattern data stored in the first test pattern data storing unit and serially provides the stored test pattern data in synchronization with a second clock signal at the second speed. In one embodiment, the first test pattern data storing unit stores the serially stored test pattern data in parallel in response to a first load signal. In one embodiment, the second test pattern data storing unit stores the test pattern data stored in the first test pattern data storing unit in parallel in response to a second load signal. In one embodiment, the speed converting unit comprises: a test control unit that provides a first clock provision request signal, a second clock provision request signal, a first load signal, and a second load signal according to predetermined timing in response to a test request signal; a first clock providing unit which receives the first clock provision request signal and provides a first clock signal; a first test pattern data storing unit which serially stores the test pattern data input from the input terminal in synchronization with the first clock signal and stores the serially stored test pattern data in parallel in response to the first load signal; a second clock providing unit which receives the second clock provision request signal and provides a second clock signal; and a second test pattern data storing unit which stores the test pattern data transmitted from the first test pattern data storing unit in parallel in response to the second load signal and serially provides the stored test pattern data in synchronization with the second clock signal.

According to another aspect of the present invention, there is provided a test board for testing a semiconductor device, the test board including a circuit board, a high-speed converting unit which is formed on the circuit board and includes a first input terminal to which test pattern data is serially input at a low speed and a first output terminal which one-to-one corresponds to the first input terminal and serially outputs the test pattern data at a high speed, a socket which is formed on the circuit board, wherein a semiconductor device to be tested is mountable in the socket such that the semiconductor device receives the test pattern data output from the high-speed converting unit, and operates at the high speed, and a low-speed converting unit which is formed on the circuit board and includes a second input terminal to which test pattern data output from the semiconductor device to be tested at the high speed is serially input and a second output terminal which one-to-one corresponds to the second input terminal and serially outputs the test pattern data at the low speed.

In one embodiment, the high-speed is n times higher than the low-speed and the test pattern data is input to the first input terminal without repetition and the first output terminal outputs the test pattern data n times repetitively, where n is natural number.

In one embodiment, the high-speed is n times higher than the low-speed and the test pattern data is input to the second input terminal inputs n times repetitively and the second output terminal outputs the test pattern data without repetition, where n is natural number.

In one embodiment, the high-speed converting unit comprises: a first test pattern data storing unit which serially stores the test pattern data in synchronization with a first clock signal at low speed; and a second test pattern data storing unit which receives and stores the test pattern data stored in the first test pattern data storing unit and serially provides the stored test pattern data in synchronization with a second clock signal at high speed.

In one embodiment, the low-speed converting unit comprises: a third test pattern data storing unit which serially stores the test pattern data in synchronization with a third clock signal at high speed; and a fourth test pattern data storing unit which receives and stores the test pattern data stored in the fourth test pattern data storing unit and serially provides the stored test pattern data in synchronization with a fourth clock signal at low speed.

In one embodiment, the semiconductor device to be tested includes a third input terminal, a third output terminal, and a feed-through path that electrically connects the third input terminal and the third output terminal without passing through an internal circuit and transmits test pattern data input through the third input terminal to the third output terminal through the feed-through path.

According to still another aspect of the present invention, there is provided a test system for testing a semiconductor device, the test system including a tester that operates at a low speed, a first semiconductor device to be tested which includes a first input terminal to which test pattern data provided from the tester at the low speed is serially input and a first output terminal which one-to-one corresponds to the first input terminal and serially outputs the input test pattern data at a high speed, and a second semiconductor device to be tested which includes a second input terminal to which the test pattern data output from the first semiconductor device to be tested at the high speed is serially input and a second output terminal which one-to-one corresponds to the second input terminal and serially outputs the input test pattern data at the low speed.

In one embodiment, the high-speed is n times higher than the low-speed and the test pattern data is input to the first input terminal without repetition and the first output terminal outputs the test pattern data n times repetitively, where n is natural number.

In one embodiment, the high-speed is n times higher than the low-speed and the test pattern data is input to the second input terminal inputs n times repetitively and the second output terminal outputs the test pattern data without repetition, where n is natural number.

In one embodiment, the semiconductor device to be tested includes a first input terminal, a first output terminal, and a feed-through path that electrically connects the first input terminal and the first output terminal without passing through an internal circuit and transmits test pattern data input through the first input terminal to the first output terminal through the feed-through path.

In one embodiment, the test board further comprises a speed converting unit that is formed on the first feed-through path, receives test pattern data from the first input terminal, and serially provides the test pattern data to the first output terminal at the second speed.

In one embodiment, the semiconductor device to be tested includes a second input terminal, a second output terminal, and a feed-through path that electrically connects the second input terminal and the second output terminal without passing through an internal circuit and transmits test pattern data input through the second input terminal to the second output terminal through the feed-through path.

In one embodiment, the test board further comprises a speed converting unit that is formed on the second feed-through path, receives test pattern data from the second input terminal, and serially provides the test pattern data to the second output terminal at the second speed.

According to a further aspect of the present invention, there is provided a test method for testing a semiconductor device, the test method including providing a first semiconductor device to be tested and a second semiconductor to be tested, each of which includes an input terminal to which test pattern data is serially input at a first speed and an output terminal which one-to-one corresponds to the input terminal and serially outputs the test pattern data at a second speed that is different from the first speed, in which the second speed is higher than the first speed in a first test mode and the second speed is lower than the first speed in a second test mode, electrically connecting the output terminal of the first semiconductor device to be tested in the first test mode and the input terminal of the second semiconductor device to be tested in the second test mode, serially applying the test pattern data to the input terminal of the first semiconductor device to be tested in the first test mode and receiving the test pattern data output from the output terminal of the second semiconductor device to be tested in the second test mode to determine a normal operation, electrically connecting the output terminal of the second semiconductor device to be tested in the first test mode and the input terminal of the first semiconductor device to be tested in the second test mode, and serially applying the test pattern data to the input terminal of the second semiconductor device to be tested in the first test mode and receiving the test pattern data output from the output terminal of the first semiconductor device to be tested in the second test mode to determine a normal operation.

In one embodiment, the second speed is n times higher than the first speed and the test pattern data is input to the input terminal of the semiconductor to be tested in the first test mode without repetition and the output terminal of the semiconductor to be tested in the first test mode outputs the test pattern data n times repetitively, where n is natural number.

In one embodiment, the first speed is n times higher than the second speed and the test pattern data is input to the input terminal of the semiconductor to be tested in the second test mode inputs n times repetitively and the output terminal of the semiconductor to be tested in the second test mode outputs the test pattern data without repetition, where n is natural number.

In one embodiment, the first and second semiconductor device to be tested includes a feed-through path that electrically connects the input terminal and the output terminal without passing through an internal circuit and transmits test pattern data input through the input terminal to the output terminal through the feed-through path.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 10 is a flowchart illustrating a test method for testing a semiconductor device, according to an embodiment of the present invention.

DETAILED DESCRIPTION OF PREFERRED EMBODIMENTS OF THE INVENTION

Figure 1:
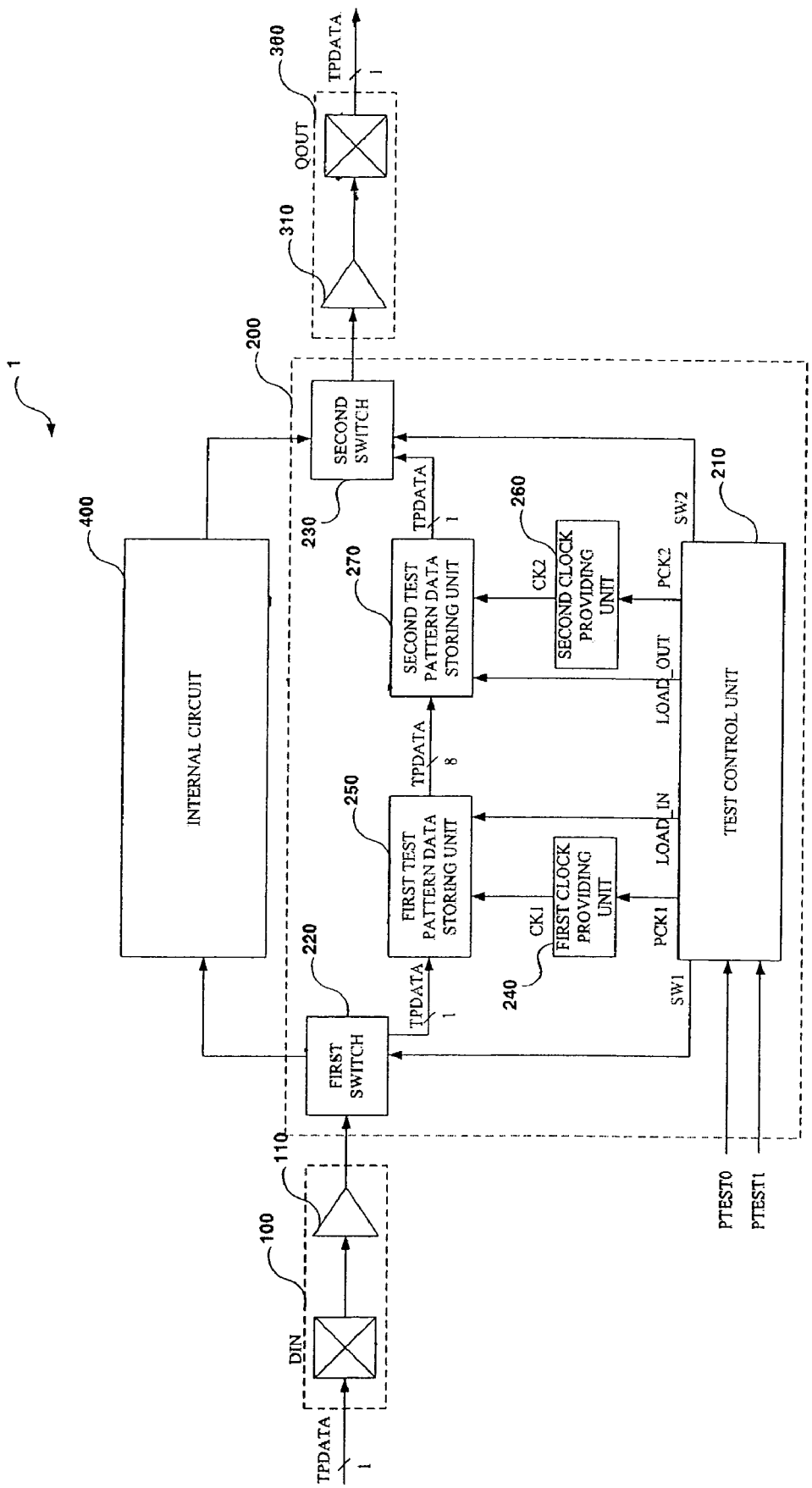
FIG. 1 is a block diagram of a semiconductor device according to an embodiment of the present invention.

FIG. 1 is a block diagram of a semiconductor device according to an embodiment of the present invention.

Referring to FIG. 1, a semiconductor device 1 according to an embodiment of the present invention includes an input terminal 100, a speed converting unit 200, and an output terminal 300.

Data is serially input from the outside to the input terminal 100 at high speed in a normal mode, and test pattern data TPDATA is serially input to the input terminal 100 at a first speed in a test mode. The input terminal 100 may include an input pin DIN and an input receiver 110 for buffering the input data or test pattern data TPDATA.

The speed converting unit 200 receives the serially input test pattern data TPDATA at the first speed in the test mode and serially provides the test pattern data TPDATA to the output terminal 300 at a second speed. The semiconductor device 1 according to an embodiment of the present invention has a first test mode where the second speed is higher than the first speed and a second test mode where the second speed is lower than the first speed. Thus, the speed converting unit 200 serially provides the test pattern data TPDATA to the output terminal 300 at the second speed that is higher than the first speed in the first test mode. If the second speed is n times higher than the first speed, where n is a natural number, the speed converting unit 200 may provide the test pattern data TPDATA n times. In addition, the speed converting unit 200 serially provides the test pattern data TPDATA to the terminal 300 at the second speed that is lower than the first speed in the second test mode. If the first speed is n times higher than the second speed, the speed converting unit 200 may provide the test pattern data TPDATA, which is provided n times through the input terminal 100, only one time.

The speed converting unit 200 includes a test control unit 210, a first switch 220, a second switch 230, a first clock providing unit 240, a first test pattern data storing unit 250, a second clock providing unit 260, and a second test pattern data storing unit 270.

The test control unit 210 provides a first switching signal SW1 for controlling the first switch 220, a second switching signal SW2 for controlling the second switch 230, a first clock provision request signal PCK1 for controlling the first clock providing unit 240, a first load signal LOAD_IN for controlling the first test pattern data storing unit 250, a second clock provision request signal PCK2 for controlling the second clock providing unit 260, and a second load signal LOAD_OUT for controlling the second test pattern data storing unit 270 according to predetermined timing in response to predetermined test request signals PTEST0 and PTEST1 indicating whether the semiconductor device 1 enters the first test mode or the second test mode.

For example, when both the first test request signal PTEST0 and the second test request signal PTEST1 are low, the semiconductor device 1 enters the normal mode. When the first test request signal PTEST0 is high and the second test request signal PTEST1 is low, the semiconductor device 1 enters the first test mode. When the first test request signal PTEST0 is low and the second test request signal PTEST1 is high, the semiconductor device 1 enters the second test mode. This relationship can be summarized as follows.

TABLE 1

| Second test request signal (PTEST1) | First test request signal (PTEST0) | Operation mode |
|---|---|---|
| 0 | 0 | Normal mode |
| 0 | 1 | First test mode |
| 1 | 0 | Second test mode |
| 1 | 1 | Don't care |

The operation timing of the first clock provision request signal PCK1, the second clock provision request signal PCK2, the first load signal LOAD_IN, and the second load signal LOAD_OUT according to the first test mode and the second test mode are described in detail hereinbelow with reference to FIGS. 5 and 6.

The first switch 220 selectively transmits the data or the test pattern data TPDATA input from the input terminal 100 to an internal circuit 400 or the first test pattern data storing unit 250 in response to the first switching signal SW1. That is, the first switch 220 transmits the input data to the internal circuit 400 in the normal mode and transmits the input test pattern data TPDATA to the first test pattern data storing unit 250 in the test mode.

The second switch 230 selectively transmits data output from the internal circuit 400 or the test pattern data TPDATA output from the second test pattern data storing unit 270 to the output terminal 300 in response to the second switching signal SW2. That is, the second switch 230 transmits the data output from the internal circuit 400 to the output terminal 300 in the normal mode and transmits the test pattern data TPDATA output from the second test pattern data storing unit 270 to the output terminal 300 in the test mode.

As such, since the first switch 220 and the second switch 230 are activated in the test mode, a feed-through path along which the test pattern data TPDATA input to the input terminal 100 is directly output to the output terminal 300 without passing through the internal circuit 400 is formed. Thus, in the performance test of the semiconductor device 1 according to an embodiment of the present invention, a failure caused by the internal circuit 400 can be avoided, and only a failure caused by operations of the input receiver 110 and an output driver 310 of the semiconductor device 1 is tested. The speed converting unit 200 is formed along the feed-through path, thereby converting input/output speeds of the test pattern data TPDATA.

The first clock providing unit 240 receives the first clock provision request signal PCK1 and provides a first clock signal CK1. It is preferable that the speed of the first clock signal CK1 be the same as the first speed at which the test pattern data TPDATA is input. The first clock providing unit 240 may be any means capable of providing a clock signal, such as a phase locked loop (PLL), a delay locked loop (DLL), or a synchronous mirror delay (SMD). When the first clock providing unit 240 is a PLL, the first clock provision request signal PCK1 may be a reference clock signal and the first clock signal CK1 may be a clock signal generated using the reference clock signal.

The first test pattern data storing unit 250 serially stores the test pattern data TPDATA input through the input terminal 100 in synchronization with the first clock signal CK1 of the first speed. Next, the first test pattern data storing unit 250 stores the serially stored test pattern data TPDATA in parallel in response to the first load signal LOAD_IN. The test pattern data storing unit 250 will be described below in more detail with reference to FIG. 2.

The second clock providing unit 260 receives the second clock provision request signal PCK2 and provides a second clock CK2 signal. It is preferable that the speed of the second clock signal CK2 be the same as the second speed at which the test pattern data TPDATA is output. The second clock providing unit 260 may be any means capable of providing a clock signal, such as a phase locked loop (PLL), a delay locked loop (DLL), or a synchronous mirror delay (SMD).

The second test pattern data storing unit 270 stores the test pattern data TPDATA transmitted from the first test pattern data storing unit 250 in parallel in response to the second load signal LOAD_OUT. Next, the second test pattern data storing unit 270 serially provides the test pattern data TPDATA stored in parallel, in synchronization with the second clock CK2 signal. As mentioned above, the second test pattern data storing unit 270 may provides the test pattern data TPDATA n times in the first test mode in response to the second load signal LOAD_OUT that is repetitively provided. The second test pattern data storing unit 270 will be described below in more detail with reference to FIG. 3.

The output terminal 300 one-to-one corresponds to the input terminal 100 and serially outputs the test pattern data TPDATA to the outside at the second speed that is different from the first speed. The output terminal 300 may include an output pin QOUT and the output driver 310 for buffering the output data or the test pattern data TPDATA.

Figure 2:
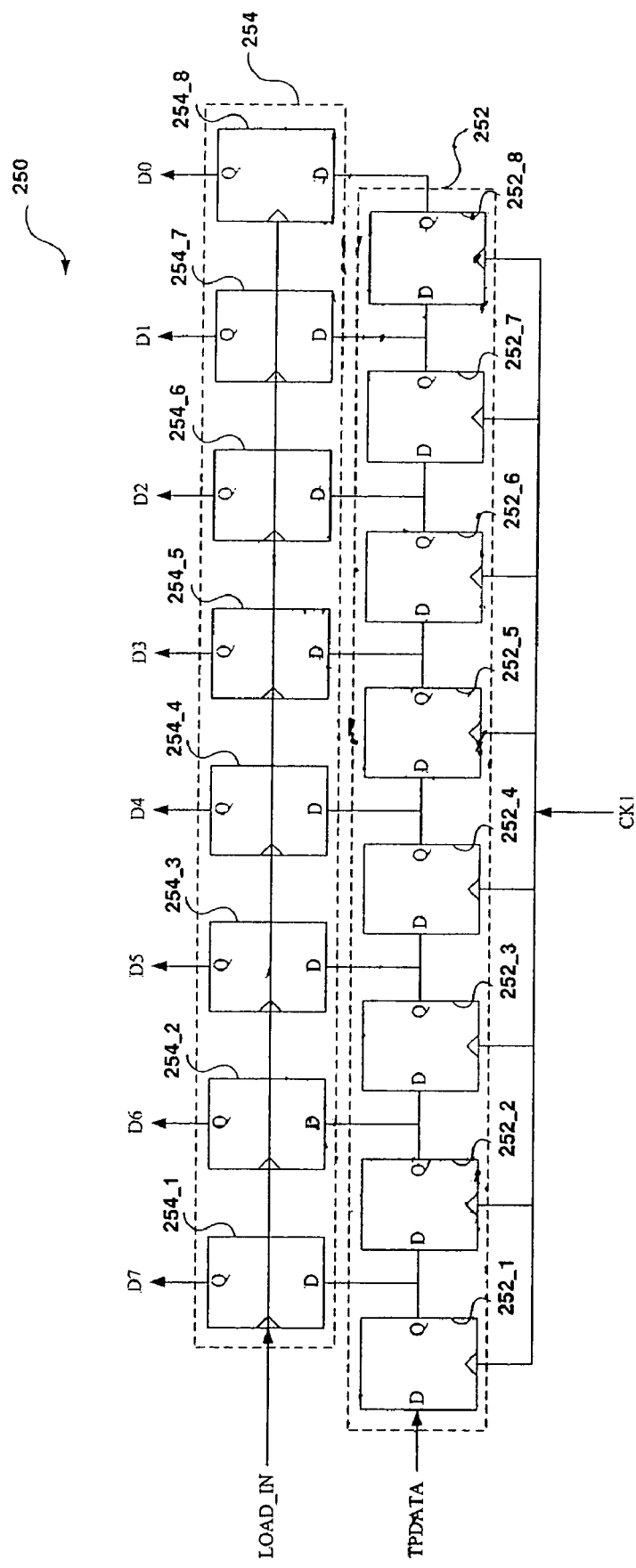
FIG. 2 is a circuit diagram of a first test pattern data storing unit of FIG. 1, according to an embodiment of the present invention.

FIG. 2 is a circuit diagram of a first test pattern data storing unit of FIG. 1. Therefore, an embodiment of the present invention describes the case of storing 8-bit test pattern data has been used as an example, but the present invention is not restricted thereto.

Referring to FIG. 2, the first test pattern data storing unit 250 includes a first storing unit 252 and a second storing unit 254.

The first storing unit 252 includes a plurality of D-type flipflops 252_i (i=1-8) connected in series. In detail, input terminals and output terminals of the plurality of D-type flipflops 252_i are connected to each other, but the test pattern data TPDATA is serially input to the input terminal of the first D-type flipflop 252_1. The first clock signal CK1 is input to control terminals of the D-type flipflops 252_i.

The second storing unit 254 includes a plurality of D-type flipflops 254_i (i=1-8) connected in parallel. Input terminals of the D-type flipflops 254_i are connected to the output terminals of the D-type flipflops 252_i. The first load signal LOAD_IN is input to control terminals of the D-type flipflops 252_i.

The first storing unit 252 serially stores the test pattern data TPDATA in synchronization with the first clock signal CK1. In more detail, first data D0 is shifted sequentially from the first D-type flipflop 252_1 to the eighth D-type flipflop 252_8 whenever the first clock signal CK1 transits to the high level. Second data D1 is shifted sequentially from the first D-type flipflop 252_1 to the seventh D-type flipflop 252_7 along the first data D0. In this way, the test pattern data TPDATA of 8 bits is stored. Next, the second storing unit 254 stores the test pattern data TPDATA stored in the first storing unit 252, in response to the first load signal LOAD_IN.

Figure 3:
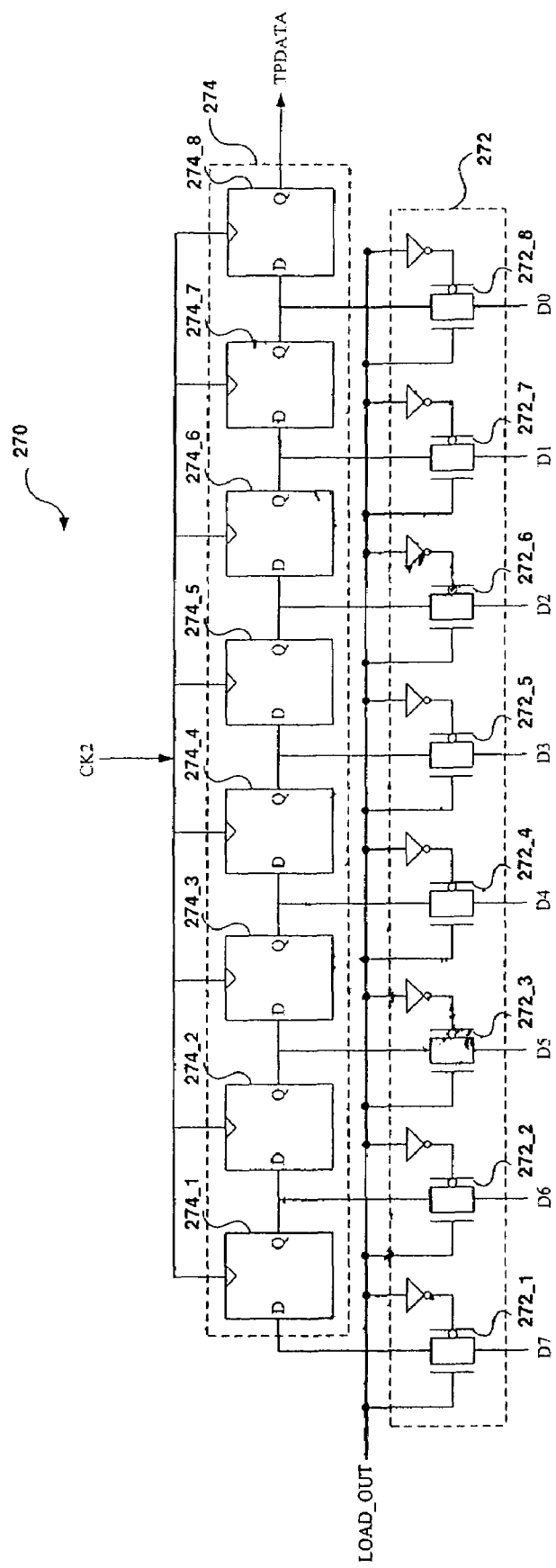
FIG. 3 is a circuit diagram of a second test pattern data storing unit of FIG. 1, according to an embodiment of the present invention.

FIG. 3 is a circuit diagram of a second test pattern data storing unit of FIG. 1. Therefore, an embodiment of the present invention describes the case of storing 8-bit test pattern data has been used as an example, but the present invention is not restricted thereto.

Referring to FIG. 3, the second test pattern data storing unit 270 includes a transmitting unit 272 and a third storing unit 274.

The transmitting unit 272 includes a plurality of transmission gates 272_i (i=1-8) connected in parallel and transmits an output signal of the second storing unit (254 of FIG. 2) of the first test pattern data storing unit (250 of FIG. 2) to the third storing unit 274 in response to the second load signal LOAD_OUT. In detail, PMOS transistors and NMOS transistors are connected in a gate-to-gate and source-to-source manner in the plurality of transmission gates 272_i. An inversion signal of the second load signal LOAD_OUT is provided to the PMOS transistors and the second load signal LOAD_OUT is provided to the NMOS transistors. Thus, the plurality of transmission gates 272_i transmits an output signal of the second storing unit 254 when the second load signal LOAD_OUT is high.

The third storing unit 274 includes a plurality of D-type flipflops 274_i (i=1-8) connected in parallel and input terminals of the D-type flipflops 274_i are connected to the output terminals of the transmission gates 272_i of the transmitting unit 272. The first clock signal CK1 is input to control terminals of the D-type flipflops 274_i.

The transmitting unit 272 transmits the test pattern data TPDATA stored in parallel in the second storing unit 254 to the third storing unit 274 in response to the second load signal LOAD_OUT. The test pattern data stored in parallel in the third storing unit 274 is serially output in synchronization with the second clock signal CK2. For example, whenever the second clock signal CK2 transits to the high level, eighth data D7 is shifted sequentially from the first D-type flipflop 274_1 to the eighth D-type flipflop 274_8 and is output.

Figure 4:
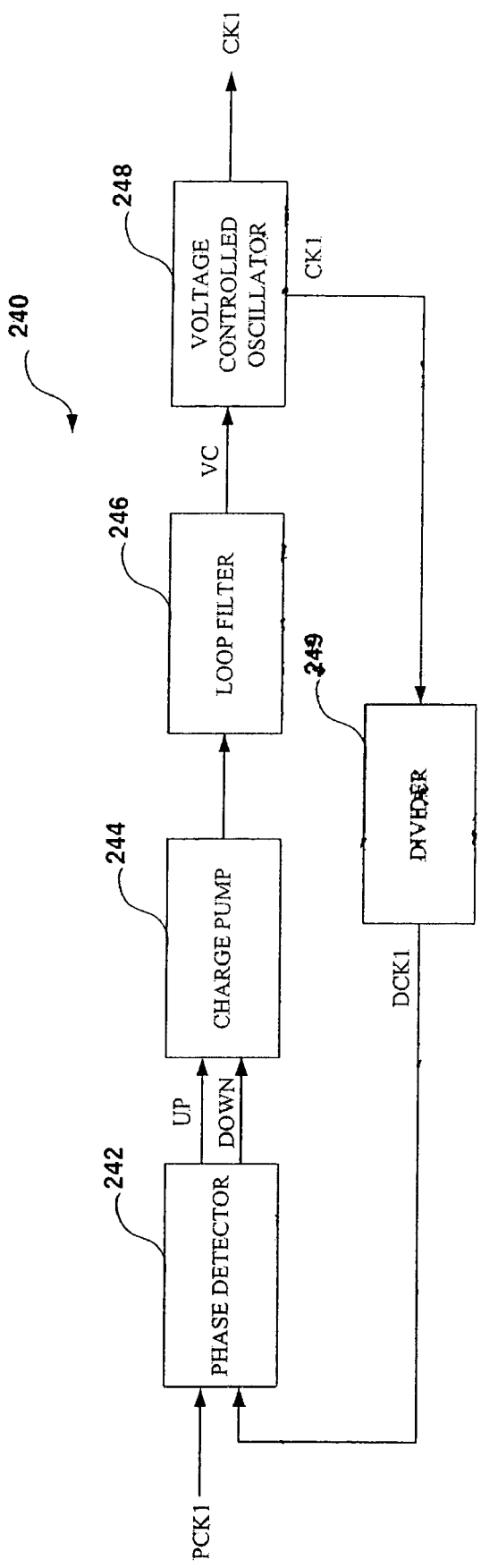
FIG. 4 is a block diagram of a first clock providing unit of FIG. 1, according to an embodiment of the present invention.

FIG. 4 is a block diagram of a first clock providing unit of FIG. 1. Therefore, the clock providing unit described as a phase locked loop (PLL) has been used as an example, but the present invention is not restricted thereto. In addition, while the first clock providing unit has been described representatively, but the first clock providing unit can also applied to the same.

Referring to FIG. 4, the first clock providing unit 240 includes a phase detector 242, a charge pump 244, a loop filter 246, a voltage controlled oscillator 248, and a divider 249.

The phase detector 242 detects a phase difference between a reference clock signal provided as the first clock provision request signal PCK1 and a comparison clock signal DCK1. Thus, the phase detector 242 provides a phase-up signal UP when the phase of the comparison clock signal DCK1 is delayed relative to the phase of the first clock provision request signal PCK1, and transmits a phase-down signal DOWN when the phase of the comparison clock DCK1 precedes the phase of the first clock provision request signal PCK1.

The charge pump 244 charges the loop filter 246 when it receives the phase-up signal UP and discharges the loop filter 246 when it receives the phase-down signal DOWN. The loop filter 246 provides a control signal VC for oscillating the voltage controlled oscillator 248 at a target frequency according to a charged or discharged current output from the charge pump 244. The voltage controlled oscillator 248 provides an oscillation output signal having a frequency corresponding to the control voltage VC, i.e., the first clock signal CK1. The divider 249 divides the frequency of the first clock signal CK1 and provides the frequency-divided clock signal as the comparison clock signal DCK1 to the phase detector 242.

Hereinafter, a first test mode operation of the semiconductor device 1 according to an embodiment of the present invention will be described with reference to FIGS. 1 through 5. As described above, the semiconductor device 1 serially outputs the test pattern data TPDATA, which is serially input at the first speed, at the second speed that is higher than the first speed in the first test mode.

When the second test request signal PTEST1 is low and the first test request signal PTEST0 is high, the semiconductor device 1 enters the first test mode. Thus, the test control unit 210 provides the first switching signal SW1 at the high level to the first switch 220, and the first switch 220 transmits the test pattern data TPDATA, which is serially input at the first speed, to the first test pattern data storing unit 250.

Next, the test control unit 210 provides the first clock provision request signal PCK1 and the second clock provision request signal PCK2 to the first clock providing unit 240 and the second clock providing unit 260, respectively. The first clock providing unit 240 and the second clock providing unit 260 provide the first clock signal CK1 and the second clock signal CK2, respectively. For example, as shown in FIG. 5, the first clock providing unit 240 provides the first clock signal CK1 having a frequency that is four times that of the reference clock signal, i.e., the first clock provision request signal PCK1 and the second clock providing unit 260 provides the second clock signal CK2 having a frequency that is eight times that of the reference clock signal i.e., the second clock provision request signal PCK2. Here, the speed of the first clock signal CK1 is the same as the first speed at which the test pattern data TPDATA is input and the speed of the second clock signal CK2 is the same as the second speed at which the test pattern data TPDATA is output.

Next, the first storing unit 252 of the first test pattern data storing unit 250 serially stores the test pattern data TPDATA in synchronization with the first clock signal CK1. Next, once the test pattern data TPDATA is serially stored in the first storing unit 252, the test control unit 210 provides the first load signal LOAD_IN at the high level to the second storing unit 254 of the first test pattern data storing unit 250 and the second storing unit 254 stores the test pattern data in parallel.

The test control unit 210 provides the second switching signal SW2 at the high level to the second switch 230, and thus a feed-through path along which the test pattern data TPDATA input through the input terminal 100 is directly output to the output terminal 300 without passing through the internal circuit 400 is formed. The second switching signal SW2 transits to the high level after the first switching signal SW1 is delayed by a predetermined time in an embodiment of the present invention, but the present invention is not limited thereto. For example, the second switching signal SW2 and the first switching signal SW1 may simultaneously transit to the high level.

After the test pattern data TPDATA is stored in parallel in the second storing unit 254, the test control unit 210 provides the second load signal LOAD_OUT at the high level to the second test pattern data storing unit 270 and the transmitting unit 272 of the second test pattern data storing unit 270 transmits the test pattern data TPDATA stored in the first test pattern data storing unit 250 to the third storing unit 274 in parallel.

Next, the third storing unit 274 of the second test pattern data storing unit 270 serially provides the test pattern data TPDATA to the second switch 230 in synchronization with the second clock signal CK2. Here, the second clock signal CK2 having the second speed is n times faster than the first clock signal CK1 having the first speed, the test pattern data TPDATA is output to the output terminal 300 n times faster than when it is input to the input terminal 100, where n is a natural number. In this case, the test pattern data TPDATA is output n times In addition, the test pattern data TPDATA may be output n times in various manners, but the test pattern data TPDATA is assumed to be output n times by sequentially providing the second load signal LOAD_OUT n times.

Figure 5:
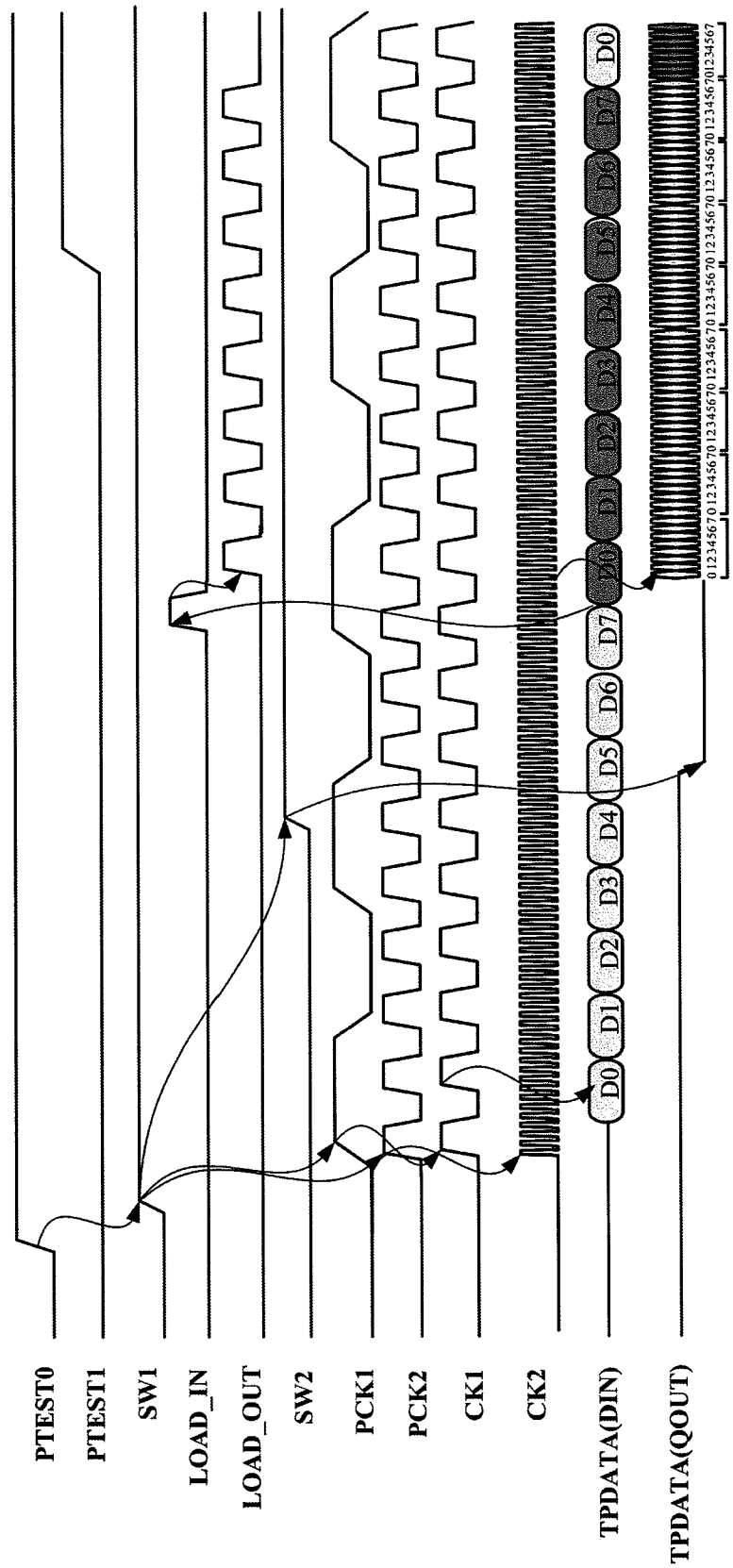
FIG. 5 is a timing diagram illustrating a first test mode operation of a semiconductor device according to an embodiment of the present invention.
Figure 6:
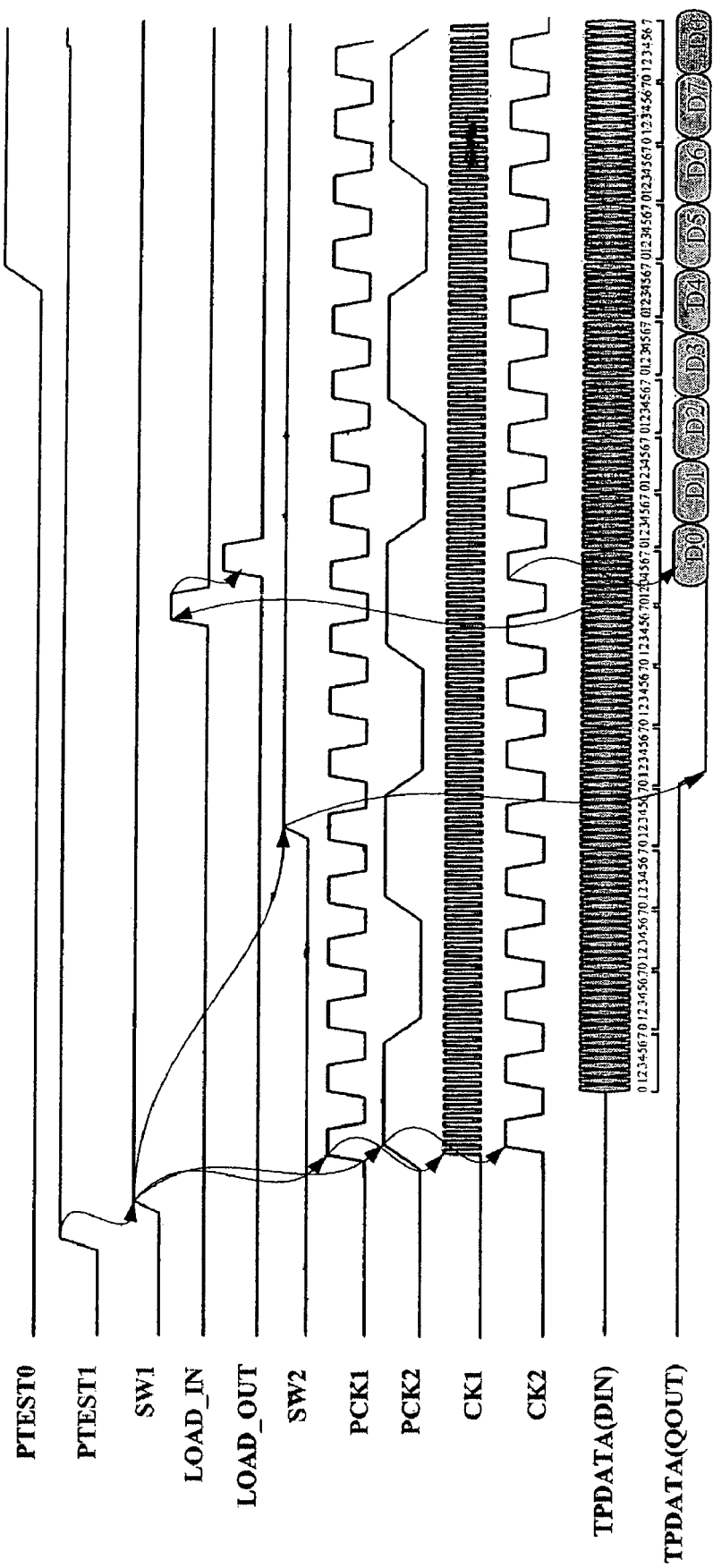
FIG. 6 is a timing diagram illustrating a second test mode operation of a semiconductor device according to an embodiment of the present invention.

For example, when the second clock signal CK2 is 8 times faster than the first clock signal CK1 as shown in FIG. 5, the second load signal LOAD_OUT continuously transits to the high level eight times. Whenever the second load signal LOAD_OUT is at the high level, the test pattern data TPDATA is stored in the third storing unit 274 of the second test pattern data storing unit 270 and the stored test pattern data TPDATA is output in synchronization with the second clock signal CK2. Thus, the test pattern data TPDATA can be repetitively output eight times.

Hereinafter, a second test mode operation of the semiconductor device 1 according to an embodiment of the present invention will be described with reference to FIGS. 1 through 4 and FIG. 6. As mentioned above, the second device 1 serially outputs the test pattern data TPDATA, which is serially input at the first speed, at the second speed that is lower than the first speed in the second test mode.

When the first test request signal PTEST0 is low and the second test request signal PTEST1 is high, the semiconductor device 1 enters the second test mode. Thus, the test control unit 210 provides the first switching signal SW1 at the high level to the first switch 220 and the first switch 220 transmits the test pattern data TPDATA serially input at the first speed to the first test pattern data storing unit 250. When the first speed is n times faster than the second speed, the same test pattern TPDATA is repetitively input n times, where n is a natural number.

Next, the test control unit 210 provides the first clock provision request signal PCK1 and the second clock provision request signal PCK2 to the first clock providing unit 240 and the second clock providing unit 260, respectively. The first clock providing unit 240 and the second clock providing unit 260, provide the first clock signal CK1 and the second clock signal CK2, respectively. For example, as shown in FIG. 5, the first clock providing unit 240 provides the first clock signal CK1 having a frequency that is eight times that of the reference clock signal, i.e., the first clock provision request signal PCK1 and the second clock providing unit 260 provides the second clock signal CK2 having a frequency that is four times that of the reference clock, i.e., the second clock provision request signal PCK2.

The first storing unit 252 of the first test pattern data storing unit 250 serially stores the test pattern data TPDATA in synchronization with the first clock signal CK1. The test pattern data TPDATA is repetitively input to the input terminal 100 n times, where n is a natural number), but only the last input test pattern data TPDATA of 8 bits may remain because the first storing unit 252 includes eight D-type flipflops 252_$i$ (i=1-8).

Thus, when the last input test pattern data TPDATA is serially input to the first storing unit 252, the test control unit 210 provides the first load signal LOAD_IN at the high level to the second storing unit 254 of the first test pattern data storing unit 250 and the second storing unit 254 stores the test pattern data TPDATA in parallel.

The test control unit 210 provides the second switching signal SW2 at the high level to the second switch 230. Thus, a feed-through path along which the test patter data TPDATA input to the input terminal 100 is directly output to the output terminal 300 without passing through the internal circuit 400 is formed.

After the test pattern data TPDATA is stored in the second storing unit 254 in parallel, the test control unit 210 provides the second load signal LOAD_OUT at the high level to the second test pattern data storing unit 270 and the transmitting unit 272 of the second test pattern data storing unit 270 transmits the test pattern data TPDATA stored in the first test pattern data storing unit 250 in parallel and stores the test pattern data TPDATA.

Next, the third storing unit 274 of the second test pattern data storing unit 270 serially provides the test pattern data TPDATA to the second switch 230 in synchronization with the second clock signal CK2.

Eventually, in the second test mode, the test pattern data TPDATA is repetitively input to the input terminal 100 n times, but is output from the output terminal 300 without repetition.

Figure 7:
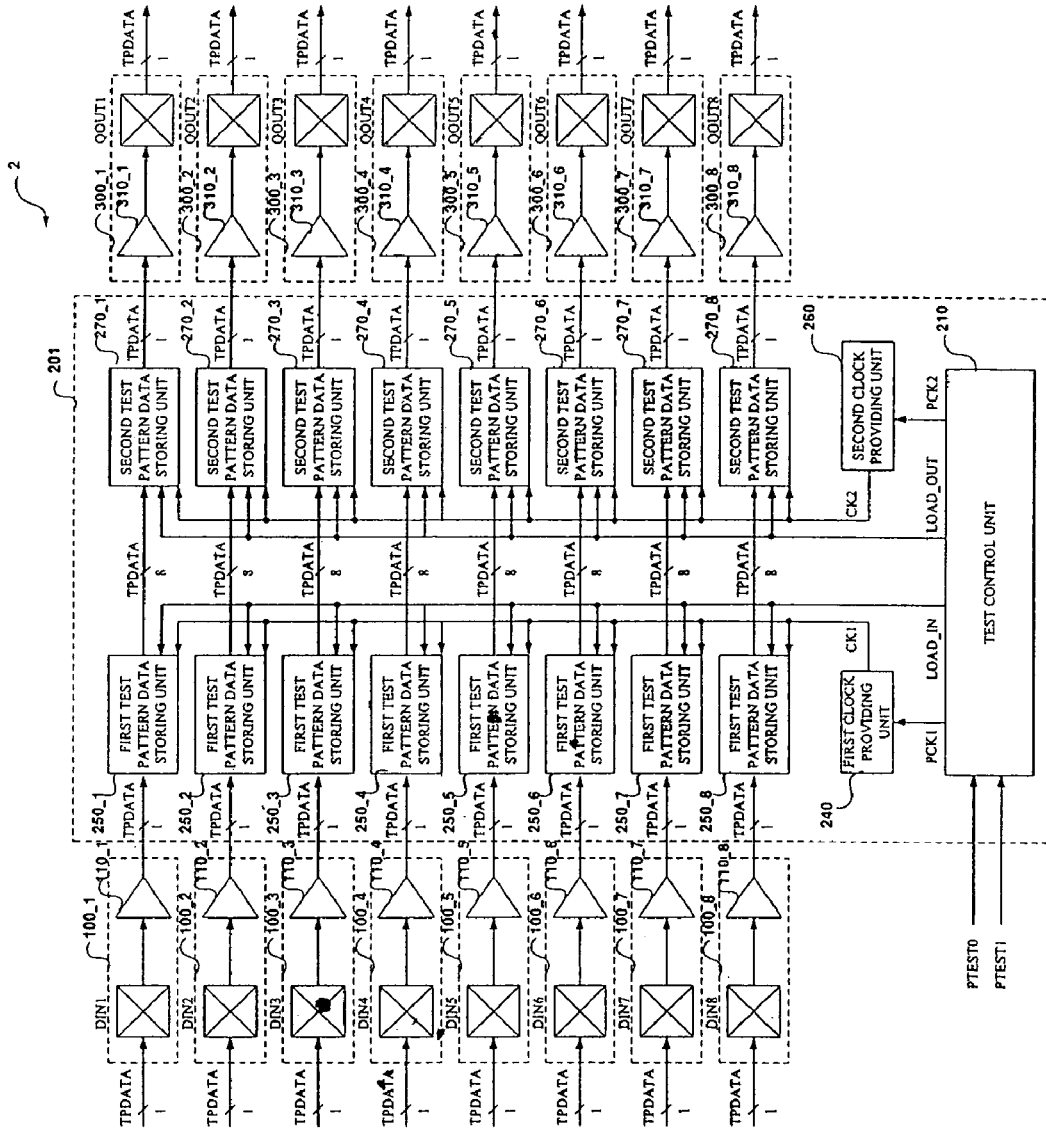
FIG. 7 is a block diagram of a semiconductor device according to another embodiment of the present invention.

FIG. 7 is a block diagram of a semiconductor device according to another embodiment of the present invention. In FIG. 7, components having the same function as that of components of the embodiment shown in FIG. 1 are identified by the same reference numerals as those of the like components of FIG. 1, and description of these components will not be repeated.

Referring to FIG. 7, a semiconductor device 2 according to another embodiment of the present invention includes a plurality of input terminals 100_$i$ (i=1-8), a speed converting unit 201, and a plurality of output terminals 300_$i$ (i=1-8).

The plurality of input terminals 100_(i=1-8) and the plurality of output terminals 300_$i$ (i=1-8) one-to-one correspond to each other, and test pattern data TPDATA input to the input terminals 100_$i$ at a first speed is output from the output terminals 300_$i$ at a second speed that is different from the first speed. The test pattern data TPDATA input to the input terminals 100_$i$ is provided to the output terminals 300_$i$ along a feed-through path connecting the input terminals 100_$i$ and the output terminals 300_$i$, without passing through an internal circuit (not shown).

The speed converting unit 201 includes first test pattern data storing units 250_$i$ (i=1-8) corresponding to the plurality of input terminals 100_$i$ (i=1-8) and second test pattern data storing units 270_$i$ (i=1-8) corresponding to the plurality of output terminals 300_$i$ (i=1-8). A test control unit 210, a first clock providing unit 240, and a second clock providing unit 260 may be commonly installed for the plurality of input terminals 100_$i$ and the plurality of output terminals 300_$i$, but the present invention is not limited thereto. For example, the test control unit 210, the first clock providing unit 240, and the second clock providing unit 260 may be installed in each of the plurality of input terminals 100_$i$ and the plurality of output terminals 300_$i$. For convenience of explanation, a first switch and a second switch are not shown.

Although 8 input terminals 100_$i$ and 8 output terminals 300_$i$ are shown in FIG. 7, it is obvious that the number of input terminals and the number of output terminals may be increased to 16, for example.

Figure 8:
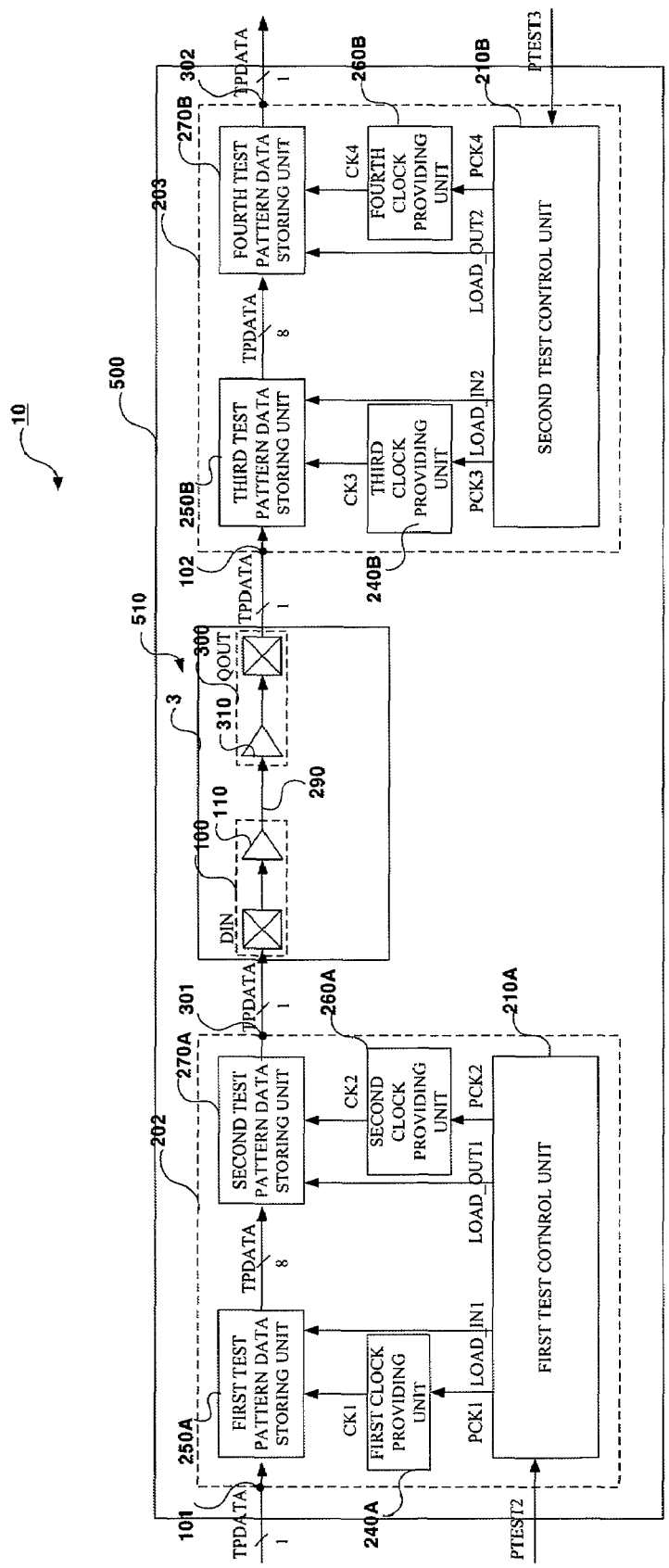
FIG. 8 is a block diagram of a test board for testing a semiconductor device, according to an embodiment of the present invention.

FIG. 8 is a block diagram of a test board for testing a semiconductor device, according to an embodiment of the present invention. In FIG. 8, components having the same function as that of components of the embodiment shown in FIG. 1 are identified by the same reference numerals as those of the like components of FIG. 1, and description of these components will not be repeated.

Referring to FIG. 8, a test board 10 for testing a semiconductor device according to an embodiment of the present invention includes a circuit board 500, a high-speed converting unit 202, a socket 510, and a low-speed converting unit 203.

The circuit board 500 includes the high-speed converting unit 202, the socket 510, and the low-speed converting unit 203 at its one side. In particular, since a high-speed operating device to be tested 3 is tested, it is preferable that a signal line formed in the circuit board 500 has high signal integrity and low impedance. For example, the signal line may be a strip line or a microstrip line.

In addition, the circuit board 500 may be, but is not limited to, a printed circuit board (PCB), a flexible PCB (FPCB), a flexible rigid PCB (FRPCB), or a ceramic board. The circuit board 500 may be, but is not limited to, a package board, a multi-chip module board, or a general mother board.

The high-speed converting unit 202 includes a first input terminal 101 to which low-speed test pattern data TPDATA provided from a tester (not shown) is serially input and a first output terminal which one-to-one corresponds to the first input terminal 101 and serially outputs the test pattern data TPDATA at high speed.

The high-speed converting unit 202 is substantially the same as the speed converting unit (200 of FIG. 1) in the first test mode. That is, when a high speed is n times faster than a low speed, where n is a natural number, the first output terminal 301 of the high-speed converting unit 202 repetitively outputs the test pattern data TPDATA input to the first input terminal 101 n times.

The speed converting unit 202 includes a first test control unit 210A, a first clock providing unit 240A, a first test pattern storing unit 250A, a second clock providing unit 260A, and a second test pattern data storing unit 270A. In detail, the first test control unit 210A is enabled in response to a predetermined test request signal PTEST2 and provides the first clock provision request signal PCK1, a first load signal LOAD_IN1, the second clock provision request signal PCK2, and a second load signal LOAD_OUT1 according to predetermined timing. The first clock providing unit 240A receives the first clock provision request signal PCK1 and provides the first clock signal CK1. The first test pattern data storing unit 250A serially stores the test pattern data TPDATA, which is serially input at a low speed, in synchronization with the first clock signal CK1 and stores the test pattern data TPDATA in parallel in response to the first load signal LOAD_IN1. The second clock providing unit 260A receives the second clock provision request signal PCK2 and provides the second clock signal CK2. The second test pattern data storing unit 270A receives the test pattern data TPDATA stored in the first test pattern data storing unit 250A in response to the second load signal LOAD_OUT1 and serially outputs the received test pattern data TPDATA in synchronization with the second clock signal CK2. In particular, the second test pattern data storing unit 270A repetitively receives the test pattern data TPDATA n times in response to the second load signal LOAD_OUT1 that is provided n times. Thus, the second test pattern data storing unit 270A repetitively outputs the test pattern data TPDATA n times in synchronization with the second clock signal CK2.

The high-speed operating DUT 3 is mounted in the socket 510. Thus, the test pattern data TPDATA output n times is input at a high speed and is then repetitively output at a high speed n times. The DUT 3 includes a second input terminal 100, a second output terminal 300, and a feed-through path 290 electrically connecting the second input terminal 100 and the second output terminal 300 without passing through an internal circuit. Thus, in the performance test of the DUT 3, only a failure caused by operations of the input receiver 110 and the output driver 310 is tested because a failure caused by the internal circuit can be avoided.

The low-speed converting unit 203 includes a third input terminal 102 to which the test pattern data TPDATA output by the DUT 3 at a high speed is serially input and a third output terminal 302 which one-to-one corresponds to the third input terminal 102 and serially outputs the test pattern data TPDATA at a low speed.

The low-speed converting unit 203 is substantially the same as the speed converting (200 of FIG. 1) in the second test mode. That is, the high speed is n times faster than the low speed, where n is a natural number, and the third output terminal 302 of the low-speed converting unit 203 outputs the test pattern data TPDATA, which is repetitively input n times to the third input terminal 102, without repetition. The low-speed converting unit 203 includes a second test control unit 210B, a third clock providing unit 240B, a third test pattern data storing unit 250B, a fourth clock providing unit 260B, and a fourth test pattern data storing unit 270B.

Figure 9:
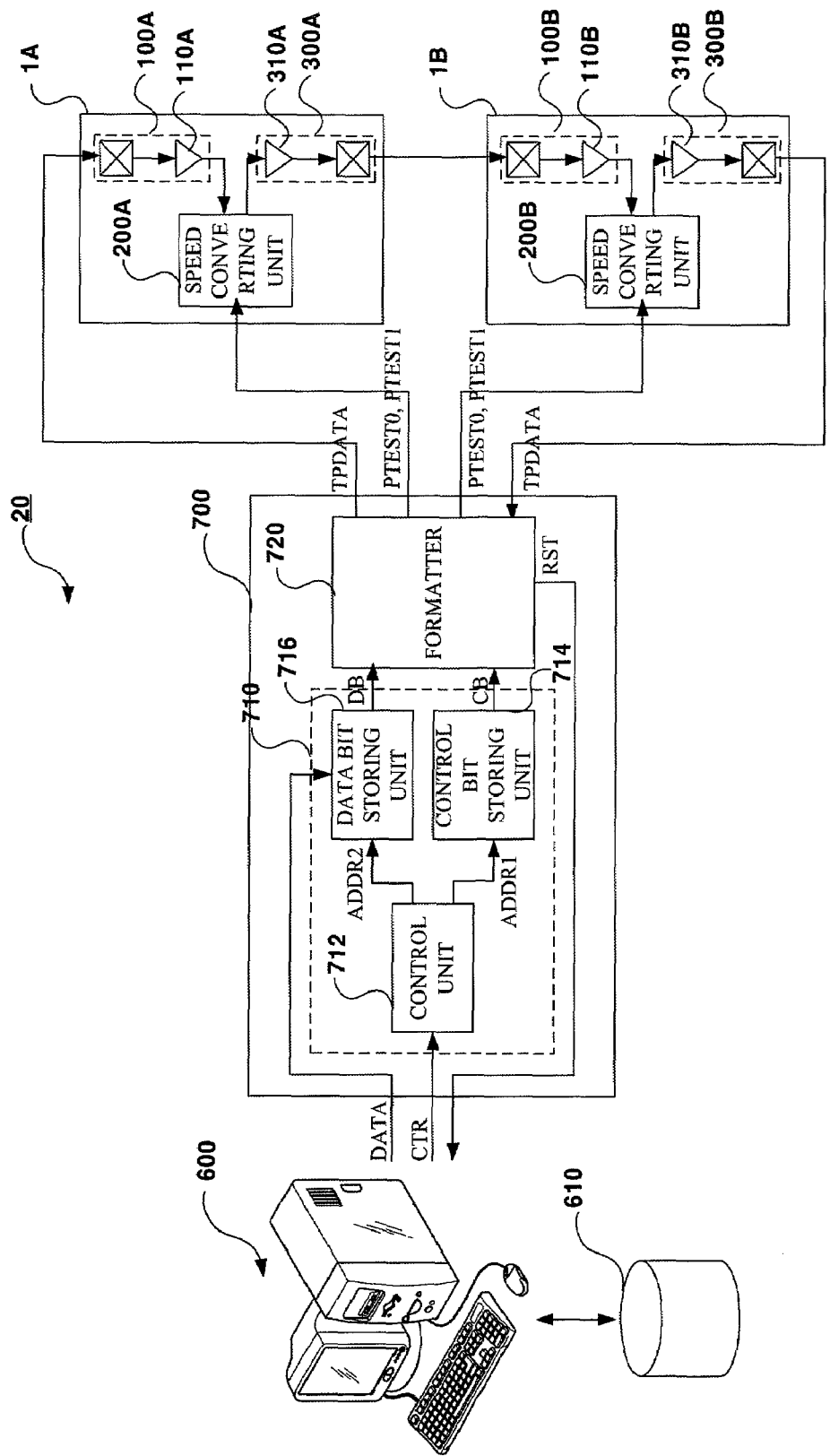
FIG. 9 is a block diagram of a test system for testing a semiconductor device, according to an embodiment of the present invention.

FIG. 9 is a block diagram of a test system for testing a semiconductor device, according to an embodiment of the present invention.

Referring to FIG. 9, a test system 200 for testing a semiconductor device according to an embodiment of the present invention includes a control computer 600, a tester 700, a first DUT 1A, and a second DUT 11B.

The control computer 600 controls the tester 700. That is, the control computer 600 provides a control signal CTR for controlling the tester 700 and loads a plurality of data DATA for generating test pattern data TPDATA into the tester 700. The control computer 600 may be a high-performance computer such as a work station or include a bulk storage unit such as a keyboard, a video display terminal, or a disk 610.

The tester 700 includes a test pattern data generator 710 and a formatter 720.

The test pattern data generator 710 includes a control unit 712, a control bit storing unit 714, and a data bit storing unit 716. The control unit 712 receives a control signal CTR of the control computer 600 and generates a first address signal ADDR1 and a second address signal ADDR2. The control bit storing unit 714 outputs a control bit CB corresponding to the received first address signal ADDR1. The data bit storing unit 716 outputs a data bit DB corresponding to the second address signal ADDR2.

The formatter 720 receives the control bit CB, generates test request signals PTEST0 and PTEST1 in a predetermined form, and provides the test request signals PTEST0 and PTEST1 to the first DUT 1A and the second DUT 1B, respectively. That is, the first DUT 1A receives the first test command signal PTEST0 of the high level and the second test command signal PTEST1 of the low level and enters the first test mode. Thus, the test pattern data TPDATA is serially input to a first input terminal 100aA of the first DUT 1A from the tester 700 at the low speed, and a first output terminal 300a one-to-one corresponds to the first imputer terminal 100a and serially outputs the input test pattern data TPDATA at the high speed.

The second DUT 1B receives the first test request signal PTEST0 of the low level and the second test request signal PTEST1 of the high level and enters the second test mode. Thus, the test pattern data TPDATA is serially input to a first input terminal 100B of the second DUT 1B from the first DUT 1A at the high speed, and a second output terminal 300B one-to-one corresponds to the second imputer terminal 100B and serially outputs the input test pattern data TPDATA at the low speed.

The formatter 720 receives a data bit DB, generates the test pattern data TPDATA in a predetermined form, and provides the test pattern data TPDATA to the first DUT 1A. The formatter 720 receives the test pattern data TPDATA output from the second DUT 1B and compares the test pattern data TPDATA provided to the first DUT 1A. Next, the formatter 720 provides a resulting signal RST to the control computer 600 according to a comparison result. Such comparison may be performed by a separate malfunction processor (not shown), instead of by the formatter 720.

Hereinafter, a test method of testing a semiconductor device according to an embodiment of the present invention will be described with reference to FIGS. 9 and 10.

Referring to FIGS. 9 and 10, the first DUT 1A and the second DUT 1B are provided in step S810.

Here, the first DUT 1A and the second DUT 1B include the first input terminal 100A and the second input terminal 100B to which the test pattern data TPDATA is serially input at the first speed and the first output terminal 300A and the second output terminal 300B which one-to-one correspond to the first input terminal 100A and the second input terminal 100B and serially output the test pattern data TPDATA at the second speed that is different from the first speed, respectively. The first DUT 1A and the second DUT 1B have the first test mode wherein the second speed is higher than the first speed and have the second test mode wherein the second speed is lower than the first speed.

The first output terminal 300A of the first DUT 1A in the first test mode and the second input terminal 100B of the second DUT 1B in the second test mode are electrically connected in step S820.

Next, the test pattern data TPDATA is serially applied to the first input terminal 100A of the first DUT 1A in the first test mode at the low speed, and the test pattern data TPDATA output from the second output terminal 300B of the second DUT 1B in the second test mode is received to determine a normal operation in step S830.

More specifically, since the tester 700 operates at the low speed and the first DUT 1A and the second DUT 1B operate at the high speed, the first DUT 1A should be in the first test mode and the second DUT 1B should be in the second test mode. By determining whether the tester 700 operates abnormally, it is possible to determine whether the first output terminal 300A of the first DUT 1A and the second input terminal 100B of the second DUT 1B operate normally at the high speed.

Next, the second terminal 300B of the second DUT 1B in the first test mode and the first input terminal 100A of the first DUT 1A in the second test mode are electrically connected in step S840.

More specifically, the positions of the first DUT 1A and the second DUT 1B are exchanged for connection. Next, the first test request signal PTEST0 and the second test request signal PTEST1 are provided to the first DUT 1A and the second DUT 1B to convert the second DUT 1B to the first test mode and convert the first DUT 1A to the second test mode.

Next, the test pattern data TPDATA is serially applied to the second input terminal 100B of the second DUT 1B in the first test mode at the low speed, and the test pattern data TPDATA output from the first output terminal 300A of the first DUT 1A in the second test mode is received to determine a normal operation in step S850.

More specifically, since the tester 700 operates at the low speed and the first DUT 1A and the second DUT 1B operate at the high speed, the second DUT 1B should be in the first test mode and the first DUT 1A should be in the second test mode. By determining whether the tester operates abnormally, it is possible to determine whether the second output terminal 300B of the second DUT 1B and the first input terminal 100A of the first DUT 1A operate normally at the high speed. As such, only through two tests, it is possible to determine whether the first input terminal 100A and the first output terminal 300A of the first DUT 1A and the second input terminal 100B and the second output terminal 300B of the second DUT 1b operate normally.

As described above, a semiconductor, test board for testing the same, and a test system and method for testing the same of the present invention according to the present invention provide certain advantages.

First, a high-speed operating semiconductor device can be tested using a low-speed operating tester.

Second, since a separate complicated circuit is not used, a failure caused by a circuit can be avoided, thereby improving the reliability of a test result.

Third, since input terminals and output terminals for inputting and outputting test pattern data one-to-one correspond to each other, a plurality of input terminals and a plurality of output terminals are not used to test a single input terminal and a single output terminal. Therefore, test efficiency and the reliability of a test result are improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor chip comprising:
   an input terminal to which test pattern data is serially input at a first speed; and
   an output terminal which one-to-one corresponds to the input terminal and serially outputs the test pattern data at a second speed that is different from the first speed;
   a feed-through path that electrically connects the input terminal and the output terminal without passing through an internal circuit, wherein the test pattern data is transmitted through the feed-through path.

2. The semiconductor chip of claim 1, wherein the second speed is higher than the first speed in a first test mode and the second speed is lower than the first speed in a second test mode.

3. The semiconductor chip of claim 1, wherein the second speed is n times higher than the first speed and the test pattern data is input to the input terminal without repetition, and the output terminal outputs the test pattern data n times repetitively, where n is natural number.

4. The semiconductor chip of claim 1, wherein the first speed is n times higher than the second speed and the test pattern data is input to the input terminal inputs n times repetitively and the output terminal outputs the test pattern data without repetition, where n is natural number.

5. The semiconductor chip of claim 1, further comprising a speed converting unit that is formed on the feed-through path, receives test pattern data from the input terminal, and serially provides the test pattern data to the output terminal at the second speed.

6. The semiconductor chip of claim 5, further comprising:
   a first test pattern data storing unit which serially stores the test pattern data in synchronization with a first clock signal at the first speed; and
   a second test pattern data storing unit which receives and stores the test pattern data stored in the first test pattern data storing unit and serially provides the stored test pattern data in synchronization with a second clock signal at the second speed.

7. The semiconductor chip of claim 6, wherein the first test pattern data storing unit stores the serially stored test pattern data in parallel in response to a first load signal.

8. The semiconductor chip of claim 7, wherein the second test pattern data storing unit stores the test pattern data stored in the first test pattern data storing unit in parallel in response to a second load signal.

9. The semiconductor chip of claim 5, wherein the speed converting unit comprises:
   a test control unit that provides a first clock provision request signal, a second clock provision request signal, a first load signal, and a second load signal according to predetermined timing in response to a test request signal;
   a first clock providing unit which receives the first clock provision request signal and provides a first clock signal;
   a first test pattern data storing unit which serially stores the test pattern data input from the input terminal in synchronization with the first clock signal and stores the serially stored test pattern data in parallel in response to the first load signal;
   a second clock providing unit which receives the second clock provision request signal and provides a second clock signal; and
   a second test pattern data storing unit which stores the test pattern data transmitted from the first test pattern data storing unit in parallel in response to the second load signal and serially provides the stored test pattern data in synchronization with the second clock signal.

10. A test board for testing a semiconductor chip, the test board comprising:
   a circuit board;
   a high-speed converting unit which is formed on the circuit board and includes a first input terminal to which test pattern data is serially input at a low speed and a first output terminal which one-to-one corresponds to the first input terminal and serially outputs the test pattern data at a high speed;

a socket which is formed on the circuit board, wherein a semiconductor chip to be tested is mountable in the socket such that the semiconductor chip receives the test pattern data output from the high-speed converting unit and operates at the high speed; and a low-speed converting unit which is formed on the circuit board and includes a second input terminal to which test pattern data output from the semiconductor chip to be tested at the high speed is serially input and a second output terminal which one-to-one corresponds to the second input terminal and serially outputs the test pattern data at the low speed;

wherein the semiconductor chip to be tested includes a third input terminal, a third output terminal, and a feed-through path that electrically connects the third input terminal and the third output terminal without passing through an internal circuit and transmits test pattern data input through the third input terminal to the third output terminal through the feed-through path.

11. The test board of claim 10, wherein the high-speed is n times higher than the low-speed and the test pattern data is input to the first input terminal without repetition and the first output terminal outputs the test pattern data n times repetitively, where n is natural number.

12. The test board of claim 10, wherein the high-speed is n times higher than the low-speed and the test pattern data is input to the second input terminal inputs n times repetitively and the second output terminal outputs the test pattern data without repetition, where n is natural number.

13. The test board of claim 10, wherein the high-speed converting unit comprises:

a first test pattern data storing unit which serially stores the test pattern data in synchronization with a first clock signal at low speed; and a second test pattern data storing unit which receives and stores the test pattern data stored in the first test pattern data storing unit and serially provides the stored test pattern data in synchronization with a second clock signal at high speed.

14. The test board of claim 10, wherein the low-speed converting unit comprises:

a third test pattern data storing unit which serially stores the test pattern data in synchronization with a third clock signal at high speed; and a fourth test pattern data storing unit which receives and stores the test pattern data stored in the fourth test pattern data storing unit and serially provides the stored test pattern data in synchronization with a fourth clock signal at low speed.

15. A test system for testing a semiconductor chip, the test system comprising:

a tester that operates at a low speed;

a first semiconductor chip to be tested which includes a first input terminal to which test pattern data provided from the tester at the low speed is serially input, a first output terminal which one-to-one corresponds to the first input terminal and serially outputs the input test pattern data at a high speed, and a feed-through path that electrically connects the first input terminal and the first output terminal without passing through an internal circuit and transmits test pattern data input through the first input terminal to the first output terminal through the feed-through path; and a second semiconductor chip to be tested which includes a second input terminal to which the test pattern data output from the first semiconductor chip to be tested at the high speed is serially input and a second output terminal which one-to-one corresponds to the second input terminal and serially outputs the input test pattern data at the low speed.

16. The test board of claim 15, wherein the high-speed is n times higher than the low-speed and the test pattern data is input to the first input terminal without repetition and the first output terminal outputs the test pattern data n times repetitively, where n is natural number.

17. The test board of claim 15, wherein the high-speed is n times higher than the low-speed and the test pattern data is input to the second input terminal inputs n times repetitively and the second output terminal outputs the test pattern data without repetition, where n is natural number.

18. The test board of claim 15, further comprising a speed converting unit that is formed on the first feed-through path, receives test pattern data from the first input terminal, and serially provides the test pattern data to the first output terminal at the second speed.

19. The test board of claim 15, wherein the second semiconductor chip to be tested further includes a second feed-through path that electrically connects the second input terminal and the second output terminal without passing through an internal circuit and transmits test pattern data input through the second input terminal to the second output terminal through the second feed-through path.

20. The test board of claim 19, further comprising a speed converting unit that is formed on the second feed-through path, receives test pattern data from the second input terminal, and serially provides the test pattern data to the second output terminal at the second speed.

21. A test method for testing a semiconductor device, the test method comprising:

providing a first semiconductor device to be tested and a second semiconductor to be tested, each of which includes an input terminal to which test pattern data is serially input at a first speed and an output terminal which one-to-one corresponds to the input terminal and serially outputs the test pattern data at a second speed that is different from the first speed, in which the second speed is higher than the first speed in a first test mode and the second speed is lower than the first speed in a second test mode;

electrically connecting the output terminal of the first semiconductor device to be tested in the first test mode and the input terminal of the second semiconductor device to be tested in the second test mode;

serially applying the test pattern data to the input terminal of the first semiconductor device to be tested in the first test mode and receiving the test pattern data output from the output terminal of the second semiconductor device to be tested in the second test mode to determine a normal operation;

electrically connecting the output terminal of the second semiconductor device to be tested in the first test mode and the input terminal of the first semiconductor device to be tested in the second test mode; and serially applying the test pattern data to the input terminal of the second semiconductor device to be tested in the first test mode and receiving the test pattern data output from the output terminal of the first semiconductor device to be tested in the second test mode to determine a normal operation.

22. The test method of claim 21, wherein the second speed is n times higher than the first speed and the test pattern data is input to the input terminal of the semiconductor to be tested in the first test mode without repetition and the output terminal of the semiconductor to be tested in the first test mode outputs the test pattern data n times repetitively, where n is natural number.

23. The test method of claim 21, wherein the first speed is n times higher than the second speed and the test pattern data is input to the input terminal of the semiconductor to be tested in the second test mode inputs n times repetitively and the output terminal of the semiconductor to be tested in the second test mode outputs the test pattern data without repetition, where n is natural number.

24. The test method of claim 21, wherein the first and second semiconductor devices to be tested include a feed-through path that electrically connects the input terminal and the output terminal without passing through an internal circuit and transmits test pattern data input through the input terminal to the output terminal through the feed-through path.

* * * * *